United States Patent
Wang et al.

(10) Patent No.: US 10,161,033 B2
(45) Date of Patent: Dec. 25, 2018

(54) METHOD FOR CLEANING LOAD PORT OF WAFER PROCESSING APPARATUS

(71) Applicant: Taiwan Semiconductor Manufacturing Co., Ltd, Hsin-Chu (TW)

(72) Inventors: Hsueh-Lei Wang, New Taipei (TW); Jen-Ti Wang, Taichung (TW); Ting-Wei Wang, Taichung (TW); Wen-Chieh Tsou, Taichung (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 447 days.

(21) Appl. No.: 14/832,173

(22) Filed: Aug. 21, 2015

(65) Prior Publication Data
US 2017/0049284 A1 Feb. 23, 2017

(51) Int. Cl.
| *C23C 16/44* | (2006.01) |
| *H01L 21/67* | (2006.01) |
| *H01L 21/00* | (2006.01) |
| *H01L 21/677* | (2006.01) |
| *H04B 7/24* | (2006.01) |
| *H01L 21/673* | (2006.01) |

(52) U.S. Cl.
CPC .......... *C23C 16/4405* (2013.01); *H01L 21/00* (2013.01); *H01L 21/67011* (2013.01); *H01L 21/67028* (2013.01); *H01L 21/67775* (2013.01); *H01L 21/67379* (2013.01); *H01L 21/67393* (2013.01); *H04B 7/24* (2013.01)

(58) Field of Classification Search
CPC ... A47L 9/02; A47L 5/24; H01L 21/00; H01L 21/67011; H01L 21/67028; H01L 21/67775; C23C 16/4405
See application file for complete search history.

(56) References Cited

U.S. PATENT DOCUMENTS

| 1,786,384 A * | 12/1930 | Amstutz | A47L 5/24 15/344 |
| 5,616,208 A * | 4/1997 | Lee | B08B 7/00 118/715 |
| 6,249,932 B1 * | 6/2001 | Chu | A47L 9/08 15/345 |
| 6,494,772 B1 * | 12/2002 | Barnes | A47L 11/16 15/385 |
| 6,643,894 B1 * | 11/2003 | Dell | A47L 9/02 134/21 |
| 7,210,992 B1 * | 5/2007 | Wade | B24B 7/188 125/38 |

(Continued)

*Primary Examiner* — Bryan R Muller
(74) *Attorney, Agent, or Firm* — McClure, Qualey & Rodack, LLP (57) ABSTRACT

A cleaning module adapted for cleaning a load port of a processing apparatus in semiconductor fabrication is provided. The cleaning module includes a housing having at least one opening formed on a bottom wall panel of the housing. The cleaning module further includes a filter unit positioned in the housing. The leaning module also includes a driving assembly. The driving assembly is arranged to correspond to the opening and positioned in the housing. The driving assembly is used to create an air flow from outside of the housing via the opening to the filter unit. The filter unit is used to separate particles or contaminants from the air flow.

20 Claims, 10 Drawing Sheets

(56) References Cited

U.S. PATENT DOCUMENTS

| | | | |
|---|---|---|---|
| 8,459,276 B2* | 6/2013 | Stevens | H01L 21/67271 |
| | | | 134/133 |
| 9,272,315 B2* | 3/2016 | Chou | B01D 46/442 |
| 9,691,640 B2* | 6/2017 | Chen | H01L 21/67028 |
| 2006/0102284 A1* | 5/2006 | Teng | H01L 21/67017 |
| | | | 156/345.29 |

* cited by examiner

FIG. 10

METHOD FOR CLEANING LOAD PORT OF WAFER PROCESSING APPARATUS

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of materials over a semiconductor substrate, and patterning the various material layers using lithography to form an integrated circuit (IC) and elements thereon. ICs in the newer generations have more complex circuits than ICs in the previous generations as technologies advance. However, for these advances to be realized, similar developments in IC processing and manufacturing are needed.

During the manufacturing of semiconductor devices, various processing steps are used to fabricate integrated circuits on a semiconductor wafer. One of the most difficult factors in the continuing evolution toward smaller device sizes and higher circuit density is to consistently form circuits with smaller critical dimensions within predetermined error windows. For example, semiconductor feature sizes are frequently subject to optical or electrical metrology inspections following photolithographic patterning and etching to ensure that critical dimensions are within acceptable limits.

Although existing methods and devices for performing the processing steps have been generally adequate for their intended purposes, they have not been entirely satisfactory in all respects. Consequently, it would be desirable to provide a solution for process control in semiconductor manufacturing operations.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the subject matter provided. Specific examples of solutions and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Figure 1:
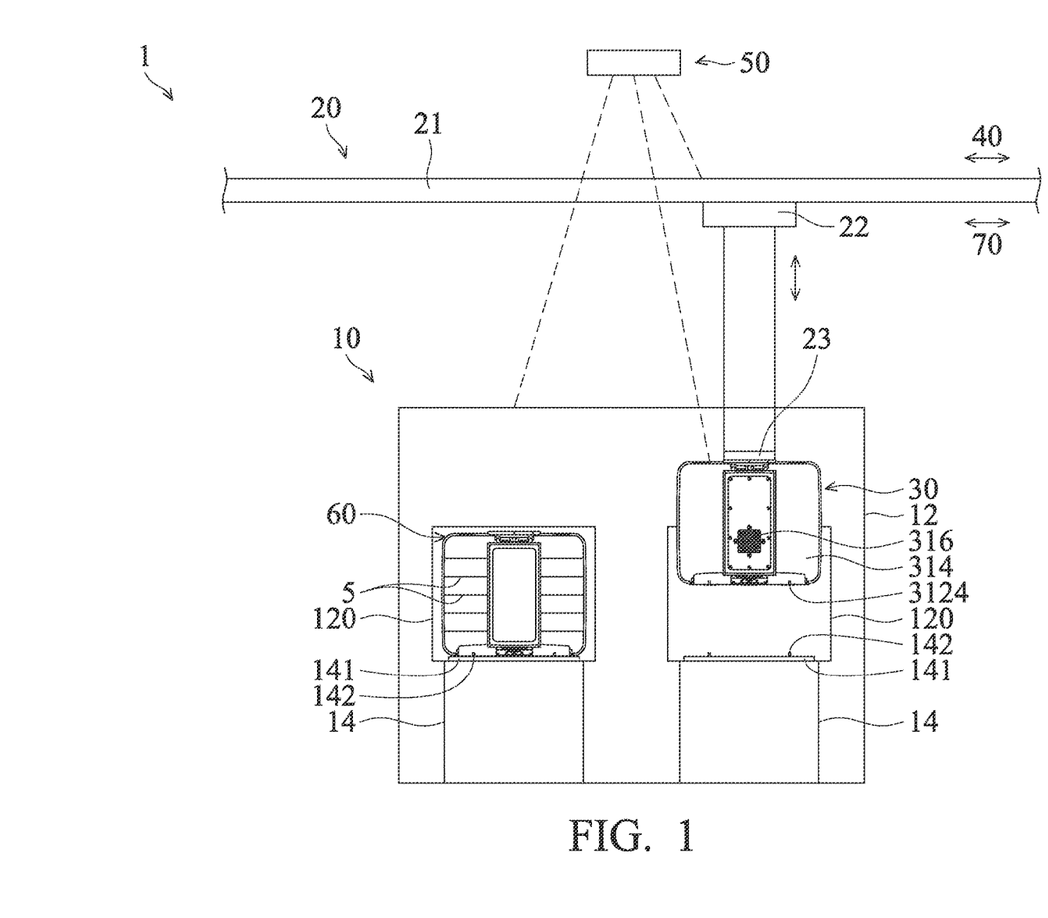
FIG. 1 shows a schematic view of a processing system, in accordance with some embodiments.

FIG. 1 shows a schematic view of a processing system 1, in accordance with some embodiments. In some embodiments, the processing system 1 includes a processing apparatus 10, a transporting apparatus 20, at least one cleaning module 30, a maintenance apparatus 40, a controlling apparatus 50, and at least one wafer carrier 60. Additional features can be added to the wafer process system, and some of the features described below can be replaced or eliminated in other embodiments of the wafer process system.

The processing apparatus 10 includes a processing module 12 and one or more load ports 14, in accordance with some embodiments. The processing module 12 is configured to process one or more semiconductor wafers 5. The processing module 12 may be configured to perform any manufacturing procedure on the semiconductor wafer 5.

The load port 14 is configured to enable the cleaning module 30 and the wafer carrier 60 to be placed at the processing apparatus 10. In some embodiments, the load port 14 includes a platform 141. The platform 141 is arranged adjacent to a door 120 of the processing module 12. The door 120 facilitates the semiconductor wafer 5 entering and/or leaving the processing module 12.

In some embodiments, the platform 141 includes a number of positioning pins 142 positioned on a top surface of the platform 141. The positioning pins 142 are configured for positioning the cleaning module 30 or the wafer carrier 60. When the cleaning module 30 or the wafer carrier 60 is placed on the platform 141, the positioning pins 142 are located in corresponding positioning holes 3124 formed on the cleaning module 30 or the wafer carrier 60. As a result, the cleaning module 30 or the wafer carrier 60 is placed in the correct position relative to the door 120 of the processing module 12. The structural features of the cleaning module 30 and the wafer carrier 60 will be described below.

The transporting apparatus 20 is configured to transport or convey the cleaning module 30 or the wafer carrier 60. The transporting apparatus 20 includes a trail assembly 21, an overhead hoist transport (OHT) assembly 22, in accordance with some embodiments. The trail assembly 21 is mounted on the ceiling of a FAB, for example. The OHT assembly 22 is suspended by the trail assembly 21, and the transportation or the movement of the OHT assembly 22 on the trail assembly 21 is controlled by the controlling apparatus 50.

In some embodiments, the OHT assembly 22 is equipped with a gripper (not shown) that can grasp the cleaning module 30 and the wafer carrier 60. In some embodiments, the OHT assembly 22 transports the cleaning module 30 between the maintenance apparatus 40 and the processing apparatus 10. In addition, the OHT assembly 22 transports the wafer carrier 60 between a stocker 70 and the processing apparatus 10.

Figure 2:
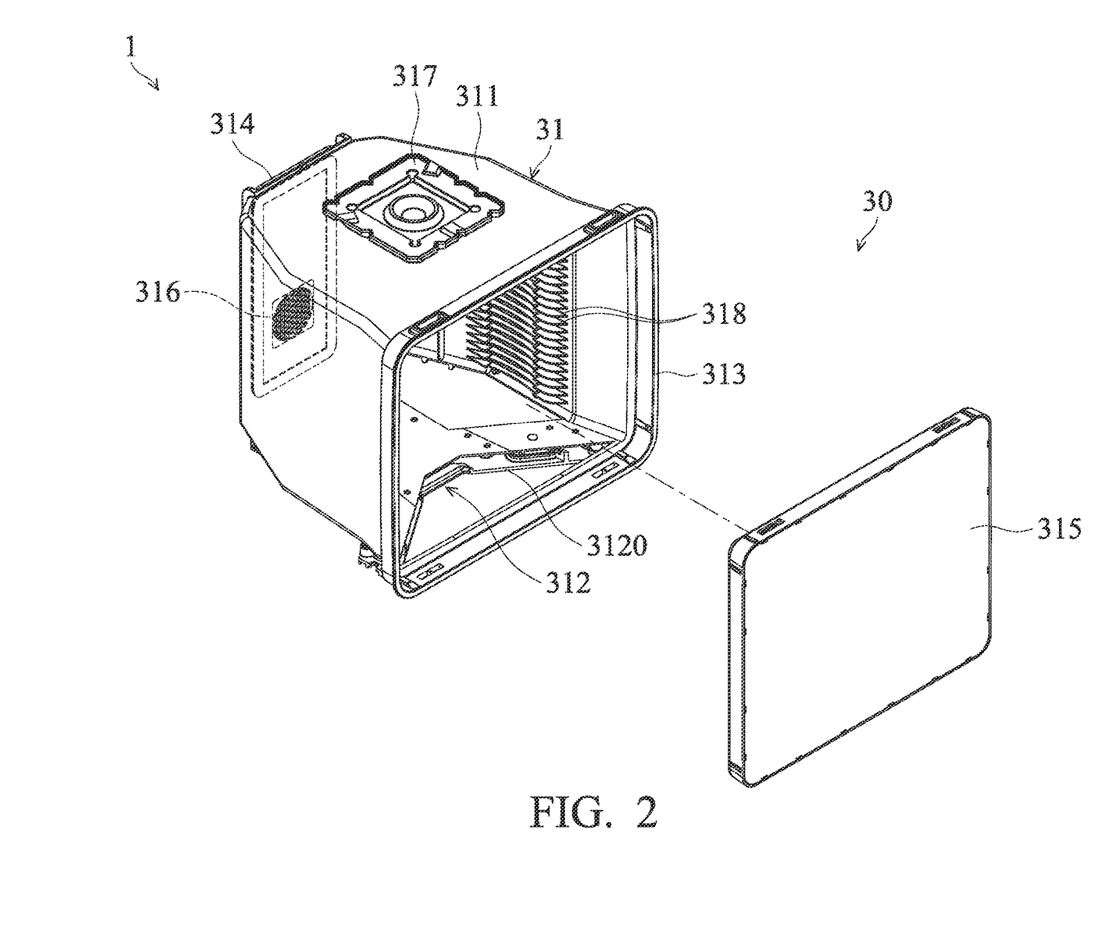
FIG. 2 shows a schematic diagram of partial elements of a cleaning module, in accordance with some embodiments.

FIG. 2 shows a schematic diagram of partial elements of the cleaning module 30, in accordance with some embodiments. In some embodiments, the cleaning module 30 includes a housing 31. The housing 31 defines an enclosure therein and has a top wall panel 311, a bottom wall panel 312, and a number of side wall panels, such as a front wall panel 313 and a rear wall panel 314, connecting the top wall panel 311 to the bottom wall panel 312. The top wall panel 311 is opposite to the bottom wall panel 312, and the front wall panel 313 is opposite to the rear wall panel 314.

In some embodiments, a door 315 is positioned on the front wall panel 313. The door 315 is selectively positioned in a closed state or an opened state. In addition, a number of ventilation holes 316 (See FIG. 1) are formed on the rear wall panel 314. The ventilation holes 316 allow the inside of the housing 31 to communicate with the outside surroundings. Moreover, a holding plate 317 is positioned on the top wall panel 311. The holding plate 317 is configured for being gripped by a gripper 23 of the transporting apparatus 20, as shown in FIG. 1.

In some embodiments, a number of slots 318 are formed on the inner surface of the side wall panels which connecting the front wall panel 313 to the rear wall panel 314. Each of the slots 318 extends along a direction parallel to the top wall panel 311 or the bottom wall panel 312. The functions of the slots 318 are described in the embodiments referring to FIG. 7.

Figure 3:
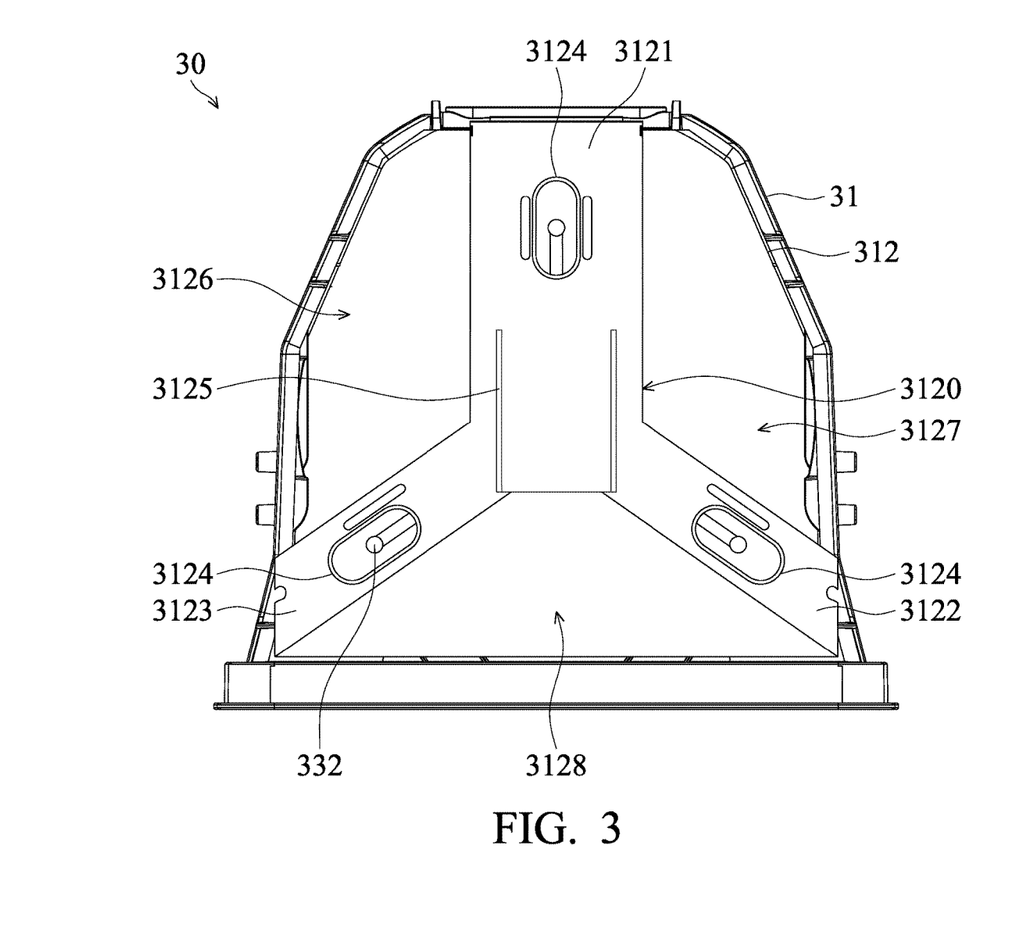
FIG. 3 shows a schematic diagram of partial elements of a cleaning module, in accordance with some embodiments.

FIG. 3 shows a bottom view of the partial elements of the cleaning module 30, in accordance with some embodiments. In some embodiments, the bottom wall panel 312 includes a Y-shaped bracket 3120. In some embodiments, the Y-shaped bracket 3120 includes three segments 3121, 3122, and 3123. The three segments 3121, 3122, and 3123 extend radially from the center of the bottom wall panel 312 to the edge of the bottom wall panel 312.

In some embodiments, each of the three segments 3121, 3122, and 3123 includes a positioning hole 3124 for facilitating the positioning of the cleaning module 30 relative to the processing module 12. In some embodiments, at least one sensor 3125 is positioned at one of the three segments 3121, 3122, and 3123. The sensor 3125 is configured to detect whether the cleaning module 30 is placed on a surface, such as the surface of the platform 141 of the load port 14.

In some embodiments, the Y-shaped bracket 3120 defines three openings 3126, 3127, and 3128 on the bottom wall panel 312. Each two of the neighboring openings 3126, 3127, and 3128 are separated by one of the three segments 3121, 3122, and 3123. The ratio of the area of all of the three openings 3126, 3127, and 3128 and the entire area of the bottom wall panel 312 may be about 60%.

Figure 4:
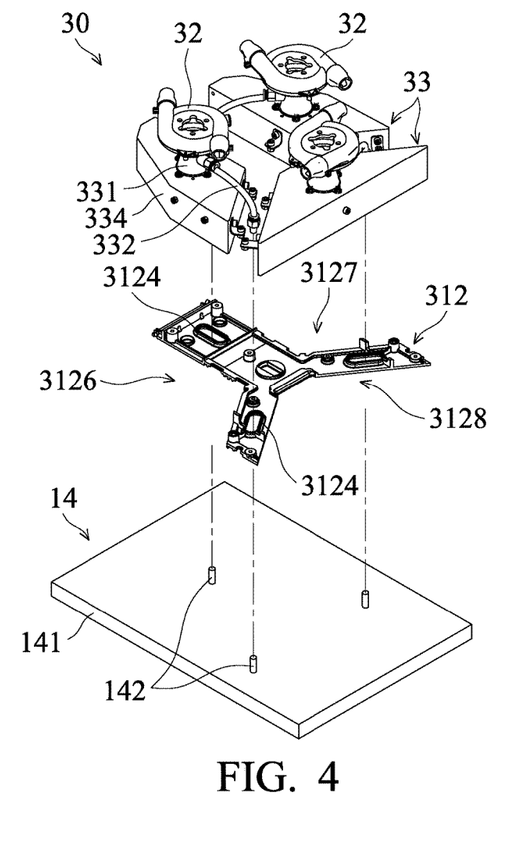
FIG. 4 shows an exploded view of partial elements of a cleaning module and a processing apparatus, in accordance with some embodiments.

FIG. 4 shows a schematic diagram of partial elements of the cleaning module 30, in accordance with some embodiments. In some embodiments, the cleaning module 30 further includes one or more driving assembles 32 and one or more air flow passages 33. In some embodiments, the number of driving assembles 32 and the number of air flow passages 33 corresponds to the number of openings formed on the bottom wall panel 312 (FIG. 3). For example, in the embodiments shown in FIG. 4, the bottom wall panel 312 has three openings 3126, 3127, and 3128. The cleaning module 30 accordingly includes three driving assembles 32 and three the air flow passages 33. However, it should be appreciated that other variations and modifications can be made to embodiments of the disclosure.

The driving assembles 32 are configured to create a vacuum. The driving assembly 32 may include a pump, driven by an electric motor, or other suction means for pumping air flow into the housing 31 (See FIG. 3) via the opening 3126, 3127, and 3128 and the positioning holes 3124.

The air flow passages 33 are configured to guide air flow actuated by the driving assembles 32 from the outside of the cleaning module 30 (See FIG. 3) via the bottom wall panel 312 into the driving assembles 32. In some embodiments, each of the air flow passages 33 includes a main conduit 331, an air pipe 332, and an air guiding nozzle 334. The upper end of the main conduit 331 is connected to an inlet port of the driving assembles 32. The lower end of the main conduit 331 is connected to the air guiding nozzle 334.

The air pipe 332 is configured to guide the air flow actuated by the driving assembles 32 from the outside of the cleaning module 30 via the positioning holes 3124 into the driving assembles 32. In some embodiments, each air pipe 332 includes two ends i.e., as an inlet end and an outlet end. The outlet end of the air pipe 332 is connected to the main conduit 331, and the inlet end is connected to one of the positioning holes 3124. Air flows from the positioning hole 3124 to the main conduit 331 via the air pipe 332. However, it should be appreciated that other variations and modifications can be made to embodiments of the disclosure. The air pipe 332 may include a number of inlet ends each connected to a positioning hole 3124 and an outlet end connected to the main conduit 331.

The air guiding nozzle 334 is configured to guide air flow actuated by the driving assembles 32 from the outside of the cleaning module 30 via the openings 3126, 3127, and 3128 into the driving assembles 32. In some embodiments, the air guiding nozzle 334 is arranged to correspond to one of the openings 3126, 3127, and 3128 (FIG. 3). The shape of the bottom surface of each of the air guiding nozzle 334 is compatible with the shape of the corresponding openings 3126, 3127, and 3128. Therefore, the entire area of each of the openings 3126, 3127, and 3128 is covered by the corresponding air guiding nozzle 334. The area of the load port 14 to be cleaned by the cleaning module is maximized.

In some embodiments, the air flow passage 33 includes a helical-shaped conduit with a number of gas inlet holes. The gas inlet holes are arranged facing the bottom wall panel 312. The helical-shaped conduit is connected to the filter unit 35 via the driving assembly 32. The driving assembly 32 may be positioned in a position that is higher than the filter unit 35 via an air pipe.

Figure 5:
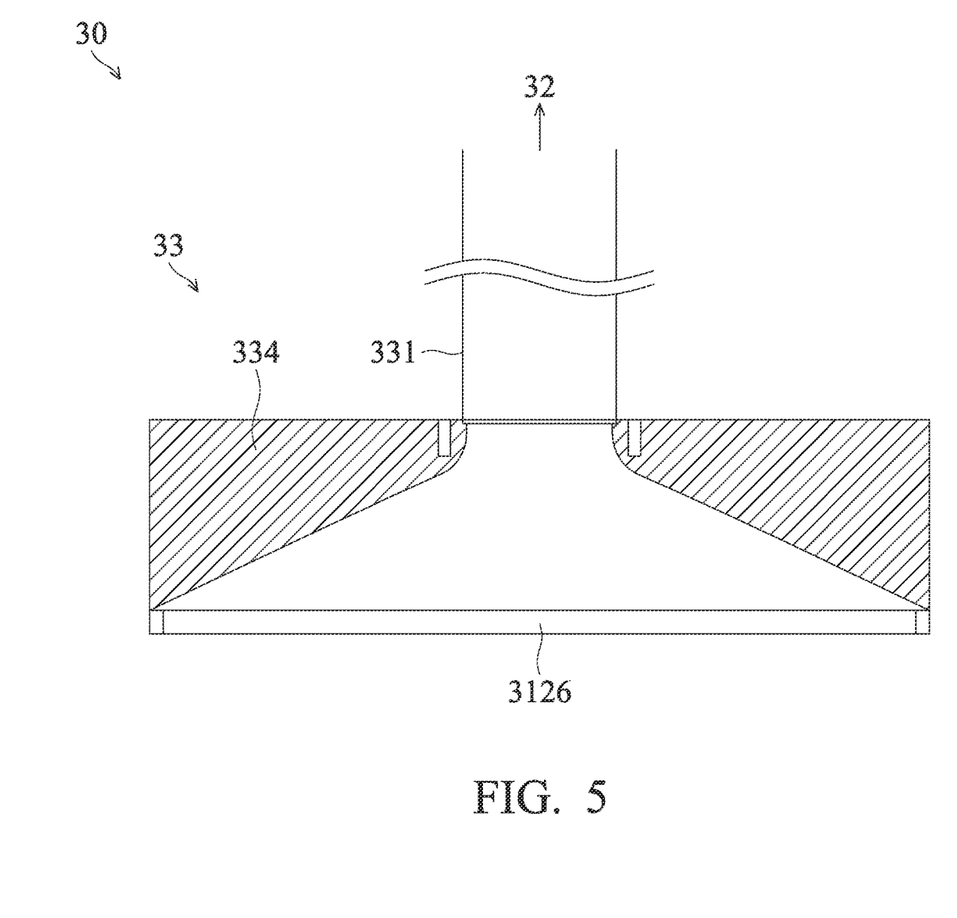
FIG. 5 shows a cross-sectional view of an air guiding nozzle in accordance with some embodiments.

FIG. 5 shows a cross-sectional view of an air guiding nozzle in accordance with some embodiments. In some embodiments, each of the air guiding nozzles 334 has an inner surface with a conical cross section. Namely, each of the air guiding nozzles 334 has a cross section with a gradually decreasing width along a direction away from the corresponding openings 3126, 3127, and 3128, and the driving assembly 32 is connected to the top end of the air guiding nozzle 334.

Figure 6:
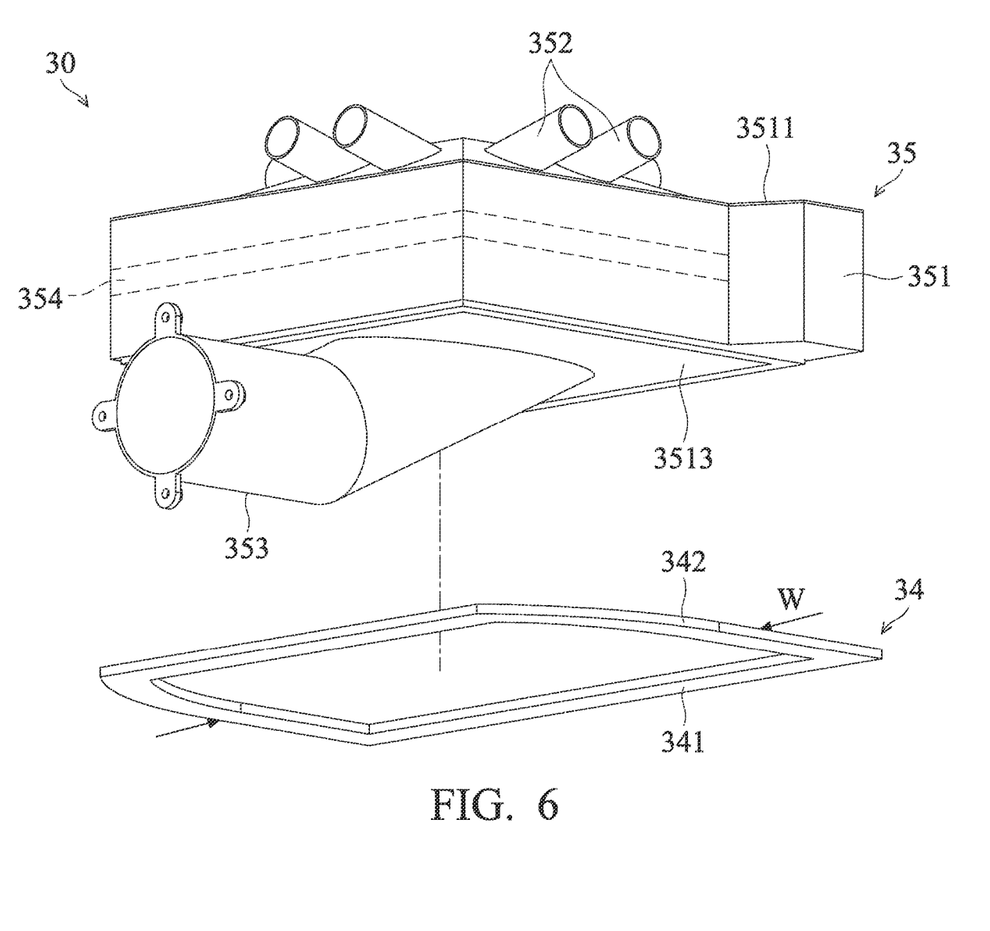
FIG. 6 shows an exploded view of partial elements of a cleaning module, in accordance with some embodiments.

FIG. 6 shows a schematic diagram of partial elements of the cleaning module 30, in accordance with some embodiments. In some embodiments, the cleaning module 30 further includes a number of base brackets 34 (only one base bracket 34 is shown in FIG. 6) and a filter unit 35.

Each of the base brackets 34 is configured to support one element of the cleaning module 30 which may be changed after a period of operation. In some embodiments, the base bracket 34 includes a first edge portion 341 and a second edge portion 342. The first edge portion 341 extends straightly, and the second edge portion 342 connected to two ends of the first edge portion 341. The second edge portion 342 includes at least one segment which has a curved shape.

In some embodiments, the largest width W1 of the second edge portion 342 along a direction parallel to the first edge portion 341 is substantially equals to or slightly smaller than the largest width between two corresponding slots 318 (See FIG. 2) of the housing 31. As a result, the second edge portion 342 is able to be placed between the two corresponding slots 318. In some embodiments, the largest width W of the second edge portion 342 is of 300 mm which is as the same as a diameter of 12 inch semiconductor wafer 5. As a result, the base brackets 34 can be placed into a wafer carrier which is used to contain a 12 inch semiconductor wafer 5. However, it should be appreciated that other variations and modifications can be made to embodiments of the disclosure.

The filter unit 35 is configured to filter dirt, particles, and contaminants from the air flow created by the driving assembly 32. In some embodiments, the filter unit 35 includes a case 351, a number of air inlets 352, an air outlet 353, and a filter element 354. The air inlets 352 are formed on the upper surface 3511 of the case 351 and connected to the driving assembles 32 via suitable means such as pipes. The air outlet 353 is formed on the lower surface 3513 of the case 351 and obliquely extends along a direction away from the case 351. The filter element 354 is positioned in the case 351.

The filter element 354 may include chemical filter and a high-efficiency particulate air filter. In some embodiments, the filter element 354 includes multiple filters such as a first filter and a second filter. The first filter is a chemical filter. The airborne molecular contamination in the air flow is removed by the first filter. Afterwards, the airborne molecular contamination in the gas is greatly reduced after passing through the second filter. The second filter is employed to remove submicron-sized particles from the gas. In some embodiments, the second filter is a high-efficiency particulate air (HEPA) filter.

Figure 7:
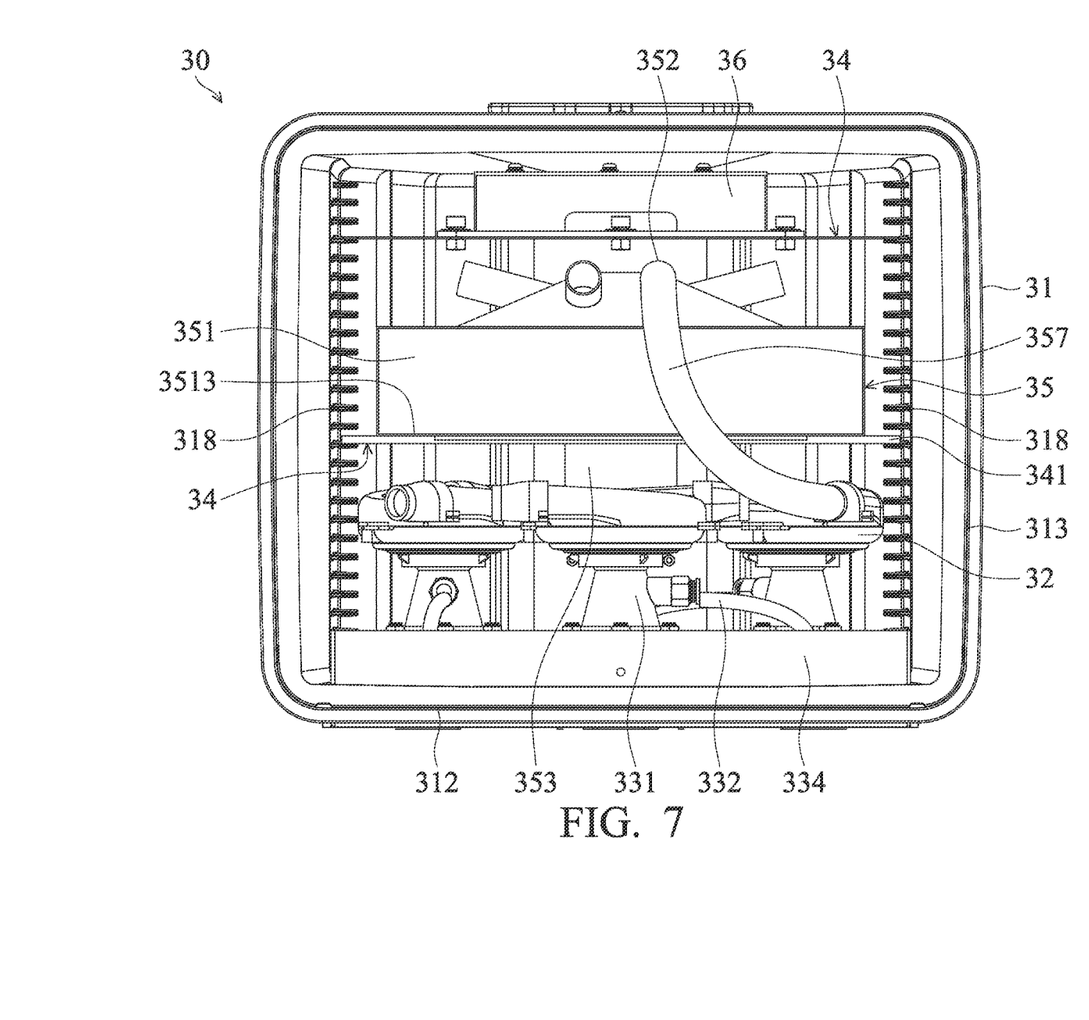
FIG. 7 shows a schematic diagram of partial elements of a cleaning module, in accordance with some embodiments.

FIG. 7 shows a schematic diagram of partial elements of the cleaning module 30, in accordance with some embodiments. In some embodiments, to assembly the filter unit 35, the filter unit 35 is firstly positioned on the base bracket 34 via the lower surface 3513 of the case 351. Afterwards, the base bracket 34 with the filter unit 35 is inserted into the slots 318 until the base bracket 34 abuts the inner surface of the housing 31. Afterwards, the air inlets 352 are connected to the driving assembly 32 via an air pipe 357, for example. For the purpose of clarity, in FIG. 7 only one air inlet 352 is connected to the driving assembly 32.

It should be noted that, in some embodiments, when the base bracket 34 is inserted into the slot 318, the first edge portion 341 is oriented toward the front wall panel 313, and when the door 315 is closed, the first edge portion 341 is abutted by the inner surface of the door 315 (See FIG. 3). As a result, the base bracket 34 with the filter unit 35 is firmly positioned in the housing 31. In addition, after the base bracket 34 is inserted into the slots 318, the end of the air outlet 353 is located in the vicinity of the ventilation holes 316.

In some embodiments, the cleaning module 30 further includes a battery assembly 36 positioned in the housing 31 and configured to supply power to the driving assembly 32. In some embodiments, to assembly the battery assembly 36, the battery assembly 36 is firstly positioned on another base bracket 34. Afterwards, the base bracket 34 with the battery assembly 36 is inserted into the slots 318 until the base bracket 34 abuts the inner surface of the housing 31. Afterwards, the battery assembly 36 is electrically connected to the driving assembly 32.

As the base bracket 34 which supports the filter unit 35, the first edge portion 341 of the base bracket 34 for supporting the battery assembly 36 is abutted by the door 315 when the door 315 is closed. As a result, the base bracket 34 with the battery assembly 36 is firmly positioned in the housing 31.

Figure 8:
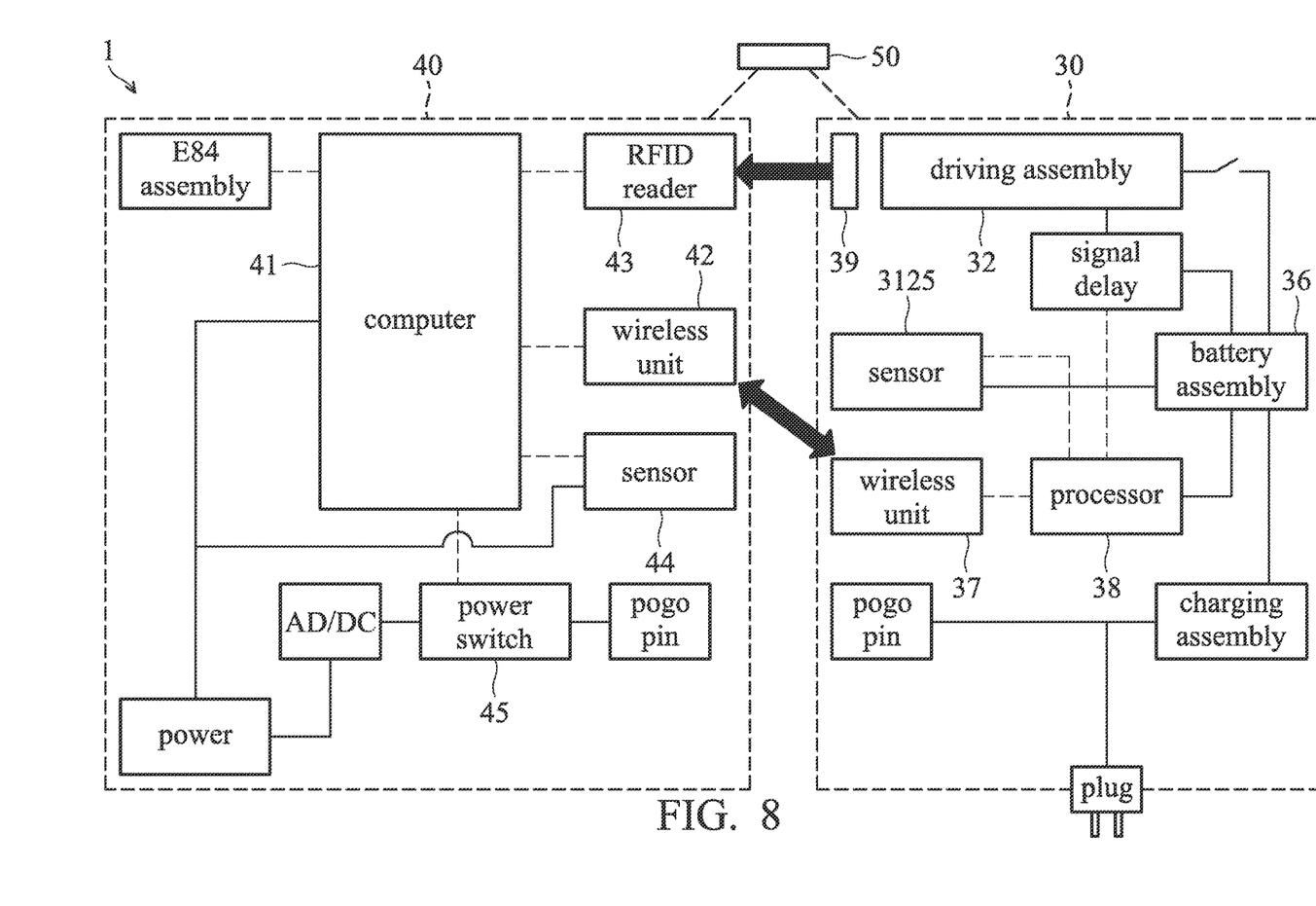
FIG. 8 shows a block diagram of a cleaning module and a maintenance apparatus, in accordance with some embodiments.

FIG. 8 shows a block diagram of the cleaning module 30 and the maintenance apparatus 40, in accordance with some embodiments. In FIG. 8, the dotted lines indicate signal lines, and the solid lines indicate power lines.

In some embodiments, the cleaning module 30 further includes a wireless unit 37, a processor 38, and an improved radio frequency identification (RFID) tag 39. The wireless unit 37 is configured to transmit/receive a measurement results or the manipulation commands. The measurement results may include detected signal from the sensor 3125 (FIG. 3), the quantity of electric charge of the battery assembly 36, the flow rate of the air flow in the air flow passages 33, and the flow rate of the air flow in the air outlet 353 of the filter unit 35. The manipulation commands may include signals from the maintenance apparatus 40 and/or the controlling apparatus 50. The processor 38 is configured to control the operation of the cleaning module 30. In some embodiments, the processor 38 controls the driving assembly 32 according to signal initiated by the wireless unit 37. The RFID tag 39 is the wireless use of electromagnetic fields to transfer data, for the purposes of automatically identifying and tracking tags attached to the cleaning module 30.

The maintenance apparatus 40 is configured to supply electric power to the cleaning module 30 when the transporting apparatus transfers the cleaning module 30 from the processing apparatus 10 to the maintenance apparatus 40. In some embodiments, the maintenance apparatus 40 includes a computer 41, a wireless unit 42, a RFID reader 43, a sensor 44, and a power switch 45. The computer 41 is configured to control the maintenance apparatus 40. The wireless unit 42 is configured to transmit/receive a measurement results or the manipulation commands. The RFID reader 43 is configured to transmit interrogator signals and also to receive authentication replies from the RFID tag 39. The sensor 44 is configured to detect whether the cleaning module 30 is placed on the maintenance apparatus 40. The power switch 45 is electrically connected to a power and configured to control the supply of power to a pogo pin.

Referring to FIG. 1, in some embodiments, the control apparatus 50 is configured for controlling the operation of the processing apparatus 10, the transporting apparatus 20, and the maintenance apparatus 40. For example, the control apparatus 50 controls the transporting apparatus 20 to convey the cleaning module 30 and/or the wafer carrier 60 from one position to another position in the processing system 1 to perform a particular process according to a preset schedule. In some embodiments, the control apparatus 50 is also configured for controlling the operation of the cleaning module 30. The control apparatus 50 may control the cleaning module 30 using wireless communication techniques. In some embodiments, the control apparatus 50 is configured for monitoring the processing apparatus 10, the transporting apparatus 20, the cleaning module 30, and the maintenance apparatus 40.

The wafer carrier 60 is configured to contain semiconductor wafers 5. The wafer carrier 60 may be a standard mechanical interface (SMIF) or a front opening unified pod (FOUP). In some embodiments, the wafer carrier 60 is used to contain a number of 12 inch semiconductor wafers 5.

The semiconductor wafer 5 may be made of silicon or other semiconductor materials. Alternatively or additionally, the semiconductor wafer 5 may include other elementary semiconductor materials such as germanium (Ge). In some embodiments, the semiconductor wafer 5 is made of a compound semiconductor such as silicon carbide (SiC), gallium arsenic (GaAs), indium arsenide (InAs), or indium phosphide (InP). In some embodiments, the semiconductor wafer 5 is made of an alloy semiconductor such as silicon germanium (SiGe), silicon germanium carbide (SiGeC), gallium arsenic phosphide (GaAsP), or gallium indium phosphide (GaInP). In some embodiments, the semiconductor wafer 5 includes an epitaxial layer. For example, the semiconductor wafer 5 has an epitaxial layer overlying a bulk semiconductor. In some other embodiments, the semiconductor wafer 5 may be a silicon-on-insulator (SOI) or a germanium-on-insulator (GOI) substrate.

The semiconductor wafer 5 may have various device elements. Examples of device elements that are formed in the semiconductor wafer 5 include transistors (e.g., metal oxide semiconductor field effect transistors (MOSFET), complementary metal oxide semiconductor (CMOS) transistors, bipolar junction transistors (BJT), high voltage transistors, high-frequency transistors, p-channel and/or n-channel field-effect transistors (PFETs/NFETs), etc.), diodes, and/or other applicable elements. Various processes are performed to form the device elements, such as deposition, etching, implantation, photolithography, annealing, and/or other suitable processes.

Figure 9:
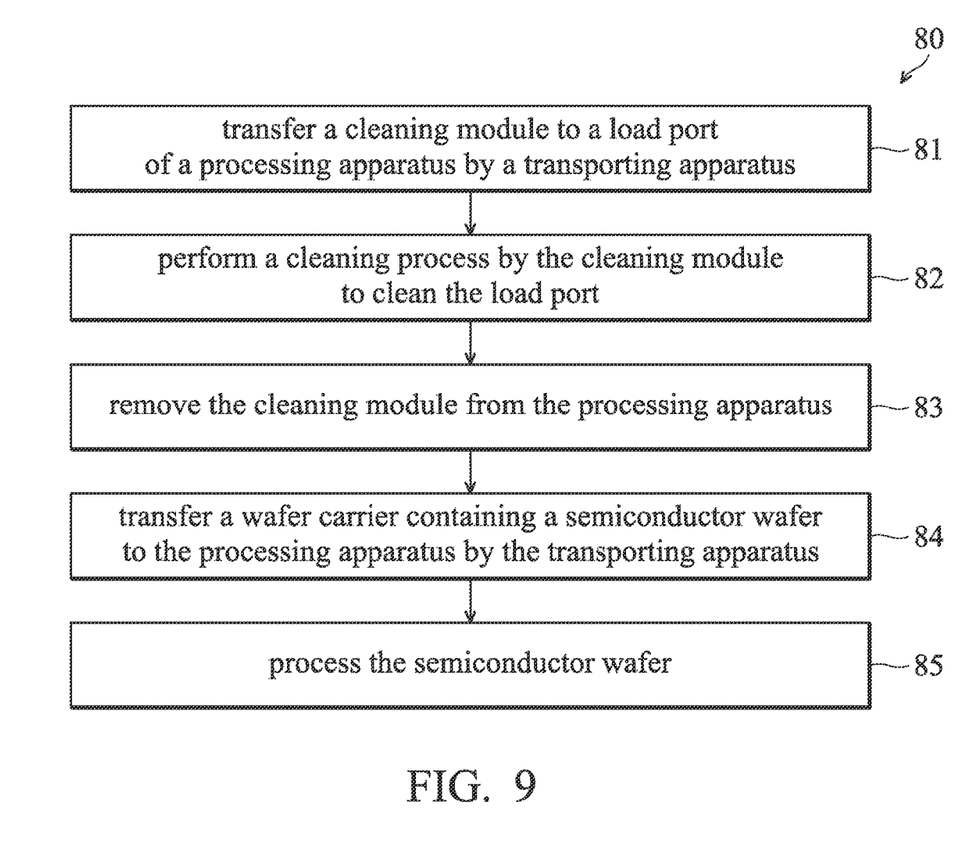
FIG. 9 shows a flow chart illustrating a method for processing a semiconductor wafer, in accordance with some embodiments.

FIG. 9 is a flow chart illustrating a method 80 for processing a semiconductor wafer, in accordance with some embodiments. For illustration, the flow chart will be described along with the schematic views shown in FIGS. 1-8 and 10. Some of the stages described can be replaced or eliminated for different embodiments.

The method 80 begins with an operation 81 in which a cleaning module (such as the cleaning module 30) is transferred a processing apparatus (such as the processing apparatus 10) by a transporting apparatus (such as the transporting apparatus 20). In some embodiments, the cleaning module 30 is transferred to the processing apparatus 10 by the following operations. First, as shown in FIG. 1, the cleaning module 30 is gripped by the OHT assembly 22 and transferred along the trail assembly 21 to the processing apparatus 10. When the OHT assembly 22 arrives the processing apparatus 10, the OHT assembly 22 is lowered down to the processing apparatus 10, and the cleaning module 30 is placed on a load port 14 of the processing apparatus 10. Afterwards, the OHT assembly 22 is raised up to be transported by the trail assembly 21.

In some embodiments, when the cleaning module 30 is placed on the load port 14 of the processing apparatus 10, the positioning pins 142 are inserted into the positioning holes 3124 formed on the bottom wall panel 312 of the cleaning module 30. As a result, the cleaning module 30 is positioned in a predetermined position on the load port 14. In some embodiments, when the cleaning module 30 is placed on the load port 14 of the processing apparatus 10, the door 120 corresponding to the load port 14 at which the cleaning module 30 is placed is kept closed.

Figure 10:
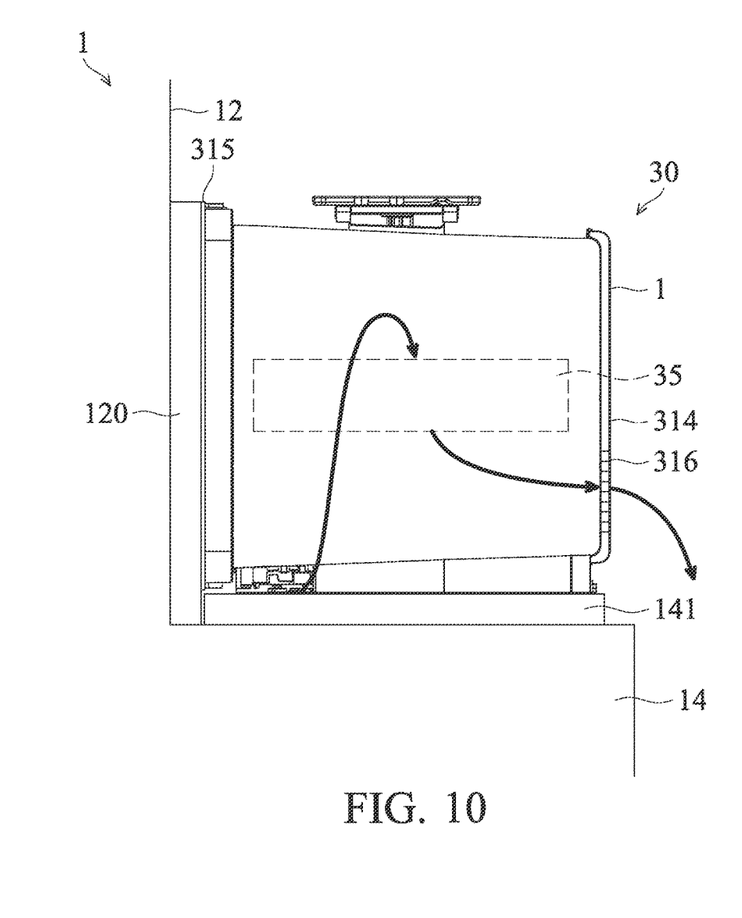
FIG. 10 shows a schematic diagram of a cleaning module being used to clean a load port of a processing apparatus, in accordance with some embodiments.

In operation 82, a cleaning process is performed by the cleaning module 30 to clean the load port 14 of the processing apparatus 10. In some embodiments, as shown in FIG. 10, in the cleaning process, the driving assembly 32 is driven to create a vacuum, so that an air flow is produced that flows from the external surroundings via the bottom wall panel 312 and the air flow passage 33 to enter the filter unit 35. Particles and contaminants on the load port 14 are removed by the air flow. As a result, the load port 14 of the processing apparatus 10 is cleaned.

Specifically, as shown in FIG. 4 *when* the driving assembly 32 is in operation, a portion of the air flows from the outside surroundings into the filter unit 35 via the openings 3126, 3127, and 3128 and the air guiding nozzles 334. Therefore, the top surface of the platform 141 is cleaned. Additionally, another portion of the air flow proceeds from the outside surroundings via the positioning holes 3124 and the air pipe 332 to enter the filter unit 35. Therefore, the positioning pins 142 and the vicinity of the positioning pins 142 are cleaned. Afterwards, when the air flow enters the filter unit 35, the filter unit 35 separates the particles and contaminants from the air flow and the particles and contaminants are collected by the filter element in the filter unit 35. Afterwards, the filtered air flow is discharged to the outside surroundings via the air outlet 353 and the ventilation holes 316.

As shown in FIG. 10, since the ventilation holes 316 are formed on the rear wall panel 314 which is oriented in a direction away from the door 315, the filtered air flow is not discharged to the processing apparatus 10. Additionally, since the air outlet 353 (See FIG. 6) extends obliquely, the filtered air flow is discharged from the cleaning module 30 in a downward direction. As a result, the remaining particles in the filtered air flow can be preserved in a region below the platform 141. Contamination of the load port 14 caused by remaining particles in the filtered air refluxing to the load port 14 can be avoided. Moreover, since the air flow passes through the filter unit 35 along a downward direction, the particles can be filtered efficiently.

In a conventional method in which the load port 14 is cleaned by a personnel by using a wiper to remove particles on the load port. A human operator may accidentally shut down the processing module while the semiconductor wafers are still being processed, which may cause a decrease of production yield. This problem is prevented by using the cleaning module to perform the cleaning process.

In operation 83, the cleaning module 30 is removed from the processing apparatus 10. In some embodiments, the cleaning process is finished as the sensor 3125 (See FIG. 3) detecting the cleaning module 30 is removed from the platform 141 of the load port 14. In addition, the cleaning process is initiated when the sensor 3125 detects the cleaning module 30 is placed on the top surface of the platform 141 of the load port 14 (See FIG. 1). Overall, the processing duration of the cleaning process is determined by the time when the transporting apparatus 20 places the cleaning module 30 to the processing apparatus 10, and the time when the transporting apparatus 20 removes the cleaning module 30 from the processing apparatus 10. The transporting apparatus 20 may be operated according to a program which is preset in the control apparatus 50. However, it should be appreciated that other variations and modifications can be made to embodiments of the disclosure.

In some embodiments, the cleaning process is initiated and finished according to commands issued by the control apparatus 50. For example, in cases where the load port 14 detects that the cleaning module 30 is placed on the load port 14 but the cleaning module 30 fails to automatically perform the cleaning process, the control apparatus 50 issues an RF signal to drive the cleaning module 30 to clean the load port 14. Afterwards, the control apparatus 50 may issue an RF signal to stop the operation of the cleaning module 30, and the cleaning process is finished.

In some embodiments, after the removal of the cleaning module 30 from the processing apparatus 10, the cleaning module 30 may be transferred to another load port to clean that load port. The cleaning module 30 may be used to clean a number of load ports. In some embodiments, the number of load ports or the sequence of the load ports to be cleaned by the cleaning module 30 is set in advance, and the control apparatus 50 controls the transporting apparatus 20 to dispatch the cleaning module 30 automatically according to the preset data.

In some embodiments, after the cleaning module 30 has been used to clean a number of load ports, the battery assembly 36 (See FIG. 7) in the cleaning module 30 may be running low, or running out of power. In this case, the cleaning module 30 is automatically transferred to the maintenance apparatus 40 to recharge the battery assembly 36 in the cleaning module 30.

For example, when the battery assembly 36 in the cleaning module 30 is running low, the wireless unit in the cleaning module 30 issues a signal to the control apparatus 50, and the control apparatus 50 drives the transporting apparatus 20 to convey the cleaning module 30 to the maintenance apparatus 40. The battery assembly 36 in the cleaning module 30 is recharged by in the maintenance apparatus 40. In some other embodiments, after the cleaning module 30 is used to clean a predetermined number of load ports, the cleaning module 30 is transferred to the maintenance apparatus 40 even if the battery assembly 36 in the cleaning module still has enough power to clean more load ports.

In some embodiments, after the cleaning module 30 has been used to clean a number of load ports, the filtering efficiency of the filter unit 35 is decreased due to air filter clogging. In this case, the cleaning module 30 is transferred to the maintenance apparatus 40 to replace the filter element in the filter unit 35. Therefore, the cleaning efficiency of the load ports is ensured.

In some embodiments, a sensor is used to detect the flow rate of the air flow in filter unit 35. After the cleaning module 30 has been used to clean a number of load ports, the flow rate of the air flow may decrease. When the detected flow rate is below a preset value, the cleaning module 30 issues a signal to the control apparatus 50, and the control apparatus 50 drives the transporting apparatus 20 to convey the cleaning module 30 to the maintenance apparatus 40. Afterwards, the filter unit 35 may be replaced by another new filter unit 35. Alternatively, other elements may be checked to ensure the cleaning efficiency of load port.

In operation 84, as shown in FIG. 1, a wafer carrier (such as wafer carrier 60) containing the semiconductor wafer 5 is delivered to the processing apparatus 10 by the transporting apparatus 20. In some embodiments, the cleaning module 30 and the wafer carrier 60 are gripped by the same OHT assembly 22. That is, both the cleaning module 30 and the wafer carrier 60 have the same holding plate for being gripped by a gripper (not shown) of the transporting apparatus 20.

In operation 85, the semiconductor wafer 5 is processed by the processing module 12. In some embodiments, to process the semiconductor wafer 5, the door 120 of the processing module 12 is opened when the wafer carrier 60 is positioned on the platform 141 of the load port 14. Afterwards, the door of the wafer carrier 60 is opened, and the semiconductor wafer 5 in the wafer carrier 60 is retrieved by a robotic arm in the processing module 12 and processed by the processing module 12.

In some embodiments, the processing module 12 is configured to perform manufacturing procedures including deposition processes such as physical vapor deposition (PVD), chemical vapor deposition (CVD), plasma-enhanced chemical vapor deposition (PECVD) and/or other deposition processes. In some embodiments, the processing module 12 is configured to perform manufacturing procedures that include etching processes such as wet and dry etching and ion beam milling. In some embodiments, the processing module 12 is configured to perform manufacturing procedures including lithographic exposure, ion implantation, thermal processes, cleaning processes, testing, any procedure involved in the processing of the semiconductor wafer 5, and/or any combination of procedures.

The embodiments of cleaning a load port of a processing apparatus in a semiconductor fabrication described above use a cleaning module which cleans the load port by creating an air flow to remove particles or contaminants from the load port. Since the cleaning module is automatically transferred by a transporting apparatus, labor for load port cleaning process is reduced or omitted, and efficiency is improved. Furthermore, a decrease in the production yield due to an alarm of the processing apparatus being accidentally triggered by human operator while cleaning the load port can be prevented. Additionally, by automatically dispatching the cleaning module to clean the load ports in a fab according to a program which is preset in a control apparatus, a condition characterized by some of the load ports not being cleaned on schedule can be prevented. Moreover, because no wiper is used to clean the load port, the cost for the cleaning process is reduced.

In accordance with some embodiments, a cleaning module is provided. The cleaning module is adapted for cleaning a load port of a processing apparatus in semiconductor fabrication. The cleaning module includes a housing. The housing has at least one opening formed on a bottom wall panel of the housing. The cleaning module further includes a filter unit positioned in the housing. The leaning module also includes a driving assembly. The driving assembly is arranged to correspond to the opening and positioned in the housing. The driving assembly is used to create an air flow from outside of the housing via the opening to the filter unit. The filter unit is used to separate particles or contaminants from the air flow.

In accordance with some embodiments, a system for fabricating semiconductor is provided. The system includes a processing apparatus that is used to process a semiconductor wafer. The system further includes a cleaning module. The system also includes a transporting apparatus. The transporting apparatus is used to transfer the cleaning module to and from the processing apparatus. The cleaning module is used to clean the processing apparatus as the cleaning module is positioned at the processing apparatus.

In accordance with some embodiments, a method for processing a semiconductor wafer is provided. The method includes transferring a cleaning module to a load port of a processing apparatus by a transporting apparatus. The method further includes performing a cleaning process by the cleaning module to clean the load port of the processing apparatus. The method also includes removing the cleaning module from the processing apparatus. In addition, the method includes transferring a wafer carrier containing the semiconductor wafer to the processing apparatus by the transporting apparatus. Furthermore, the method includes processing the semiconductor wafer by the processing apparatus.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A cleaning module adapted for cleaning a load port of a processing apparatus in semiconductor fabrication, the cleaning module comprising:
    a housing comprising a bottom wall panel configured with a size or shape corresponding to the load port so as to fit on the load port of the processing apparatus, wherein the bottom wall panel comprises a generally Y-shaped bracket having three segments, and three openings which are separated from one another by one of the segments;
    a filter unit positioned in the housing;
    three air guiding nozzles covering the openings, wherein each of the air guiding nozzles has a cross section with a gradually decreasing width along a direction away from the corresponding opening; and
    a driving assembly connected to a top end of each of the air guiding nozzles positioned in the housing, wherein the driving assembly is configured to create an air flow from outside of the housing via the openings, the air guiding nozzles and the driving assembly to the filter unit, and the filter unit is configured to separate particles or contaminants from the air flow.

2. The cleaning module as claimed in claim 1, wherein the filter unit comprises:
    a case;
    an air inlet connected to the case; and
    an air outlet connected to the case, wherein the air inlet is located in a position that is higher than the air outlet relative to the bottom wall panel,
    wherein the air outlet has a tube structure and obliquely extends along a direction away from the case, arranged such that the air flow is directed through the filter unit in a downward direction.

3. The cleaning module as claimed in claim 1, wherein a positioning hole is formed on the bottom wall panel of the housing for enabling the cleaning module to be positioned on the load port, and a portion of the air flow is drew into the housing via the positioning hole.

4. The cleaning module as claimed in claim 1, wherein a door is positioned at a front wall panel of the housing and a ventilation hole is formed on a rear wall panel of the housing which is opposite to the front wall panel, wherein the ventilation hole enables the air flow to be exhausted from the housing.

5. The cleaning module as claimed in claim 1, wherein the filter unit comprises a high-efficiency particulate air filter.

6. The cleaning module as claimed in claim 1, wherein a slot is formed in the housing for enabling the filter unit to be positioned in the housing in a removable manner.

7. The cleaning module as claimed in claim 1, further comprising a battery assembly positioned in the housing and configured to supply power to the driving assembly.

8. The cleaning module as claimed in claim 1, further comprising a sensor positioned at the bottom wall panel of the housing, wherein the sensor is configured to detect whether the cleaning module is placed on the load port.

9. A cleaning module adapted for cleaning a load port of a processing apparatus in semiconductor fabrication, the cleaning module comprising:
    a housing having an enclosure formed therein and comprising:
        a bottom wall panel configured with a size or shape corresponding to the load port so as to fit on the load port of the processing apparatus, wherein the bottom wall panel comprises a generally Y-shaped bracket having three segments, and three openings which are separated from one another by one of the segments;
        a door connected to the enclosure; and
        a plurality of slots formed on an inner surface of the housing;
    a plurality of base brackets each slidably positioned between two of the slots;
    a filter unit positioned in the housing; and
    a driving assembly removably positioned in the housing and configured to create an air flow from outside of the housing to the filter unit, and the filter unit is configured to separate particles or contaminants from the air flow;
    wherein the filter unit is positioned on one of the base brackets such that the filter unit is placed into the housing in a removable manner.

10. The cleaning module as claimed in claim 9, wherein the bottom wall panel of the housing comprises an opening, wherein the opening directly faces a platform of the load port when the housing is placed on the load port;
    wherein the driving assembly is configured to create the air flow from outside of the housing via the opening to the filter unit.

11. The cleaning module as claimed in claim 9, wherein a positioning hole is formed on the bottom wall panel of the housing for enabling the cleaning module to be positioned on the load port, and a portion of the air flow is drew into the housing via the positioning hole.

12. The cleaning module as claimed in claim 9, wherein a ventilation hole is formed on a rear wall panel of the housing which is opposite to the door, wherein the ventilation hole enables the air flow to be exhausted from the housing.

13. The cleaning module as claimed in claim 9, wherein each of the base brackets comprises:
a first edge portion extending straight and abutted by the door; and
a second edge portion connected to two ends of the first edge portion and positioned in two of the slots, wherein the second edge portion has a curved shape segment.

14. A cleaning module adapted for cleaning a load port of a processing apparatus in semiconductor fabrication, the cleaning module comprising:
a housing comprising a bottom wall panel configured with a size or shape corresponding to the load port so as to fit on the load port of the processing apparatus, wherein the bottom wall panel comprises a Y-shaped bracket having three segments, and a plurality of openings which are each separated from one another by one of the respective segments, wherein a positioning hole is formed on each of the segments of the Y-shaped bracket for enabling the cleaning module to be positioned on the load port;
a filter unit positioned in the housing;
three air guiding nozzles covering the respective openings, wherein each of the air guiding nozzles has a cross section with a gradually decreasing width along a direction away from the corresponding opening; and
a driving assembly connected to a top end of each of the air guiding nozzles positioned in the housing, wherein the driving assembly is configured to create an air flow from outside of the housing via the openings, the air guiding nozzles and the driving assembly to the filter unit, and the filter unit is configured to separate particles or contaminants from the air flow.

15. The cleaning module as claimed in claim 14, wherein the filter unit comprises:
a case;
an air inlet connected to the case; and
an air outlet connected to the case, wherein the air inlet is located in a position that is higher than the air outlet relative to the bottom wall panel,
wherein the air outlet has a tube structure and obliquely extends along a direction away from the case, arranged such that the air flow is directed through the filter unit in a downward direction.

16. The cleaning module as claimed in claim 14, wherein a portion of the air flow is drew into the housing via the positioning hole.

17. The cleaning module as claimed in claim 14, wherein a door is positioned at a front wall panel of the housing and a ventilation hole is formed on a rear wall panel of the housing which is opposite to the front wall panel, wherein the ventilation hole enables the air flow to be exhausted from the housing.

18. The cleaning module as claimed in claim 14, wherein a slot is formed in the housing for enabling the filter unit to be positioned in the housing in a removable manner.

19. The cleaning module as claimed in claim 14, further comprising a battery assembly positioned in the housing and configured to supply power to the driving assembly.

20. The cleaning module as claimed in claim 14, further comprising a sensor positioned at the bottom wall panel of the housing, wherein the sensor is configured to detect whether the cleaning module is placed on the load port.

* * * * *